United States Patent [19]
Furukawa et al.

[11] Patent Number: 5,844,330
[45] Date of Patent: Dec. 1, 1998

[54] DISCHARGE OF CAPACITOR COMPONENT

[75] Inventors: Hiroshi Furukawa; Hideyuki Kubo, both of Kawasaki, Japan

[73] Assignee: Fujitsu Limited, Kawasaki, Japan

[21] Appl. No.: 676,665

[22] Filed: Jul. 10, 1996

[30] Foreign Application Priority Data

Nov. 10, 1995 [JP] Japan ..................................... 7-293094

[51] Int. Cl.$^6$ ..................................................... H02H 3/22
[52] U.S. Cl. ................................ 307/100; 29/743; 269/21
[58] Field of Search ..................................... 307/100, 109; 361/212, 220, 301.1, 303; 294/64.1; 269/21, 13; 29/741, 743

[56] References Cited

U.S. PATENT DOCUMENTS 5,582,450 12/1996 Nagai et al. ............................ 294/64.1
5,636,435 6/1997 Okumoto et al. ........................ 29/743

*Primary Examiner*—Richard T. Elms
*Attorney, Agent, or Firm*—Staas & Halsey

[57] ABSTRACT

A capacitor component having a discharge function, a mounter machine head fit for surface-mounting of a capacitor component, and a discharge method for a capacitor component. The capacitor component having the discharge function comprises a component body incorporating a pair of electrodes for generating a capacitance therebetween, a pair of terminals electrically connected to the pair of electrodes, respectively, and a short-circuiting member provided so as to electrically connect the pair of terminals together and having a portion to be molten to cut by heating. This capacitor component is always discharged by the short-circuiting member prior to mounting of the capacitor component. The short-circuited condition of the capacitor component is canceled by soldering in the mounting, thus creating a capacitor function.

6 Claims, 12 Drawing Sheets

DISCHARGE OF CAPACITOR COMPONENT

BACKGROUND OF THE INVENTION

1. Field of the Invention

The present invention relates generally to discharge of a capacitor component, and more particularly to a capacitor component having a discharge function, a mounter machine head to be used in surface-mounting a capacitor component to a printed wiring board, and a discharge method for a capacitor component.

In mounting a capacitor component and another component (e.g., a semiconductor chip or an IC chip) to a printed wiring board, there is a possibility that a closed circuit including the capacitor component and the other component may be formed. If the capacitor component is previously charged, the energy of charges in the capacitor component may flow through a pattern on the printed wiring board to the other component in the above closed circuit, causing breakdown of the other component. It is therefore desired to overcome this problem.

The term of "to mount" used herein means to set any component on a printed wiring board and then perform soldering (inclusive of reflowing in surface-mounting). The term of "to set" used herein means to place a surface-mount component on a printed wiring board so that terminals of the component come into contact with a predetermined pattern on the printed wiring board, or means to determine the position of a component having lead terminals on a printed wiring board having holes in a condition that the lead terminals are inserted in the holes of the printed wiring board.

2. Description of the Related Art

Conventionally known is a capacitor component adapted to be mounted on a printed wiring board by soldering. The capacitor component has a component body incorporating first and second electrodes between which a capacitance is generated, and first and second terminals electrically connected to the first and second electrodes, respectively, and exposed to the outside of the component body.

In an aluminum electrolytic capacitor manufactured by using aluminum as the material of the first and second electrodes and locating an electrolyte between the first and second electrodes, a large capacitance can be easily obtained. If such an aluminum electrolytic capacitor having a large capacitance is shipped in its charged condition from a capacitor component maker, there is a possibility of electric hazard upon inadvertent touching with the terminals of the capacitor. Accordingly, discharge of the capacitor is sometimes carried out by the capacitor component vender. The discharge is effected by connecting a load resistor between the first and second terminals of the capacitor. Further, in shipping the aluminum electrolytic capacitor from the capacitor component vender, the first and second terminals of the capacitor are sometimes short-circuited by a wire or a short bar.

Also known as other types of capacitor component are a tantalum capacitor and a ceramic capacitor. The tantalum capacitor is manufactured by using a sintered tantalum rod as a positive electrode (the first or second electrode) and immersing the rod in an acidic electrolytic solution. The ceramic capacitor is manufactured usually by using ceramic as a dielectric interposed between the first and second electrodes. In general, these capacitors have capacitances smaller than the capacitance of the aluminum electrolytic capacitor, and therefore, no consideration of discharge is given to these capacitors having relatively small capacitances.

There has been a recent trend of decrease in withstand voltage of a semiconductor component. This trend is due to the following typical background.

(1) A shift of operating voltage for a semiconductor component from 5 V to 3.3V.
(2) A decrease in thickness of a dielectric film due to high integration of a semiconductor component.
(3) A decrease in size of a gap between patterns or the like in a chip.

If such a component having a low withstand voltage and a capacitor component whose discharge is not considered at all are mounted to a printed wiring board, there is a possibility that a closed circuit including the low-withstand voltage component and the capacitor component may be formed to cause breakdown of the low-withstand voltage component.

SUMMARY OF THE INVENTION

It is therefore an object of the present invention to easily effect the discharge of a capacitor component. Other objects of the present invention will become apparent from the following description.

In accordance with a first aspect of the present invention, there is provided a capacitor component to be mounted on a printed wiring board by soldering, comprising a component body incorporating first and second electrodes between which a capacitance is generated; first and second terminals electrically connected to the first and second electrodes, respectively; and a short-circuiting member provided so as to electrically connect the first and second terminals together, the short-circuiting member having a portion to be molten to cut by heating.

Preferably, the short-circuiting member is formed of low-melting point metal, and the melting point of this low-melting point metal is set equal to or lower than a soldering temperature at which the capacitor component is to be soldered to the printed wiring board.

The first and second terminals of the capacitor component are kept short-circuited by the short-circuiting member to maintain discharge of the capacitor component until the capacitor component is mounted to the printed wiring board. In mounting the capacitor component to the printed wiring board, the short-circuiting member is molten to cut by heat upon soldering.

In accordance with a second aspect of the present invention, there is provided a mounter machine head to be used in surface-mounting a capacitor component to a printed wiring board. The capacitor component has a component body incorporating first and second electrodes between which a capacitance is generated, and first and second terminals electrically connected to the first and second electrodes, respectively. The mounter machine head comprises a vacuum head and a conductive pad. The vacuum head has an opening end and a hollow inside portion communicating with the opening end, wherein the hollow inside portion is given a vacuum for attracting the capacitor component by suction. The conductive pad is provided at the opening end of the vacuum head, wherein when the capacitor component is attracted to the mounter machine head by the vacuum, the conductive pad comes into contact with the first and second terminals of the capacitor component, thereby short-circuiting the first and second terminals. The use of the mounter machine head allows discharge of the capacitor component prior to setting of the capacitor component on the printed wiring board.

In accordance with a third aspect of the present invention, there is provided a discharge method for a capacitor component. This method is applicable to the capacitor component defined in the second aspect of the present invention. A printed wiring board employed in this method has first and second patterns formed independently of each other. First, the capacitor component is set on the printed wiring board so that the first and second terminals come into contact with the first and second patterns, respectively. Secondly, a discharge jig is fitted to the printed wiring board. Alternatively, the fitting of the discharge jig to the printed wiring board may be carried out prior to the setting of the capacitor component on the printed wiring board. Thirdly, a load component is set on the printed wiring board so that a closed circuit including the load component, the capacitor component, and the first and second patterns is formed. Finally, the discharge jig is removed from the printed wiring board.

In accordance with a fourth aspect of the present invention, there is provided another discharge method for a capacitor component. This method is also applicable to the capacitor component defined in the second aspect of the present invention. A printed wiring board employed in this method has first and second patterns formed independently of each other and a dummy pattern for short-circuiting the first and second patterns. First, the capacitor component is set on the printed wiring board so that the first and second terminals come into contact with the first and second patterns, respectively. Secondly, a load component is set on the printed wiring board so that a closed circuit including the load component, the capacitor component, and the first and second patterns is formed. Finally, the dummy pattern is cut.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Some preferred embodiments of the present invention will now be described in detail with reference to the attached drawings.

Prior to the description of the preferred embodiments of the present invention, there will be described a process and a mechanism of occurrence of breakdown of another component due to discharge from a capacitor component when the capacitor component and the other component are set or mounted on a printed wiring board.

Figure 1:
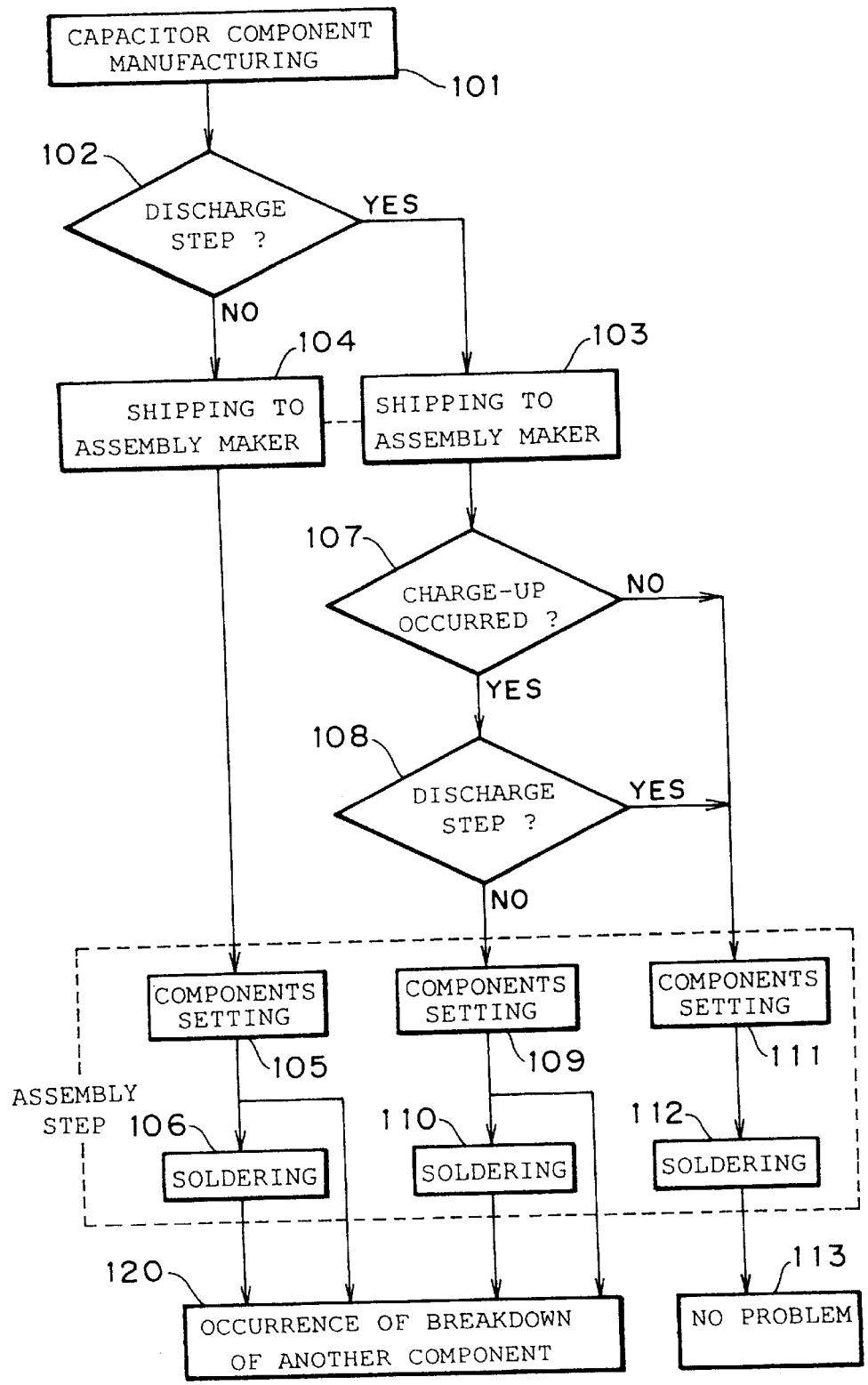
FIG. 1 is a flowchart showing a process of occurrence of breakdown of another component in the related art.

FIG. 1 is a flowchart showing a process of occurrence of breakdown of another component. A capacitor component is manufactured by a capacitor component manufacturing industry in step 101. The capacitor component is then handled in two cases. In one case, the capacitor component is subjected to a discharge step by the capacitor component maker (step 102: YES), and is shipped to an assembly maker (step 103). In the other case, the capacitor component is not subjected to the discharge step (step 102: NO), but directly shipped to the assembly maker (step 104).

In an assembly step by the assembly maker, the capacitor component shipped without being subjected to the discharge step sometimes causes breakdown of another component only after these components are set on a printed wiring board in step 105 (step 120). In some cases, a closed circuit including the capacitor component and the other component is not formed in the components setting step 105; however, the capacitor component causes breakdown of the other component after soldering step 106 (step 120).

On the other hand, the capacitor component shipped after being subjected to the discharge step also sometimes causes breakdown of another component in the assembly maker. That is, there is a case that charge-up (self-charge-up or charge-up by static electricity or the like) occurs in the capacitor component (step 107: YES), resulting in charging of the capacitor component, and the capacitor component thus charged is not subjected to a discharge step in the assembly maker (step 108: NO). In this case, the other component possibly breaks down after components setting step 109 or soldering step 110 (step 120).

The condition for avoiding breakdown of the other component is that charge-up of the capacitor component does not occur (step 107: NO), or the capacitor component charged (step 107: YES) is subjected to the discharge step (step 108: YES). In either case, there is no possibility of breakdown of the other component even after components setting step 111 and soldering step 112 (step 113).

Figure 2A:
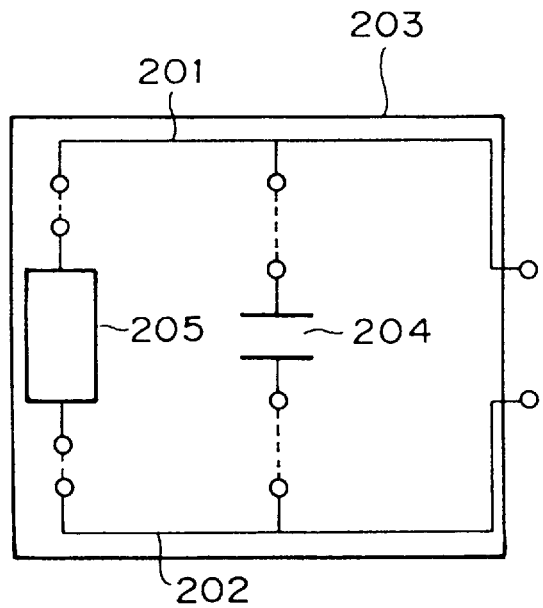
FIGS. 2A and 2B are views illustrating a mechanism of occurrence of breakdown of another component in the related art.
Figure 2B:
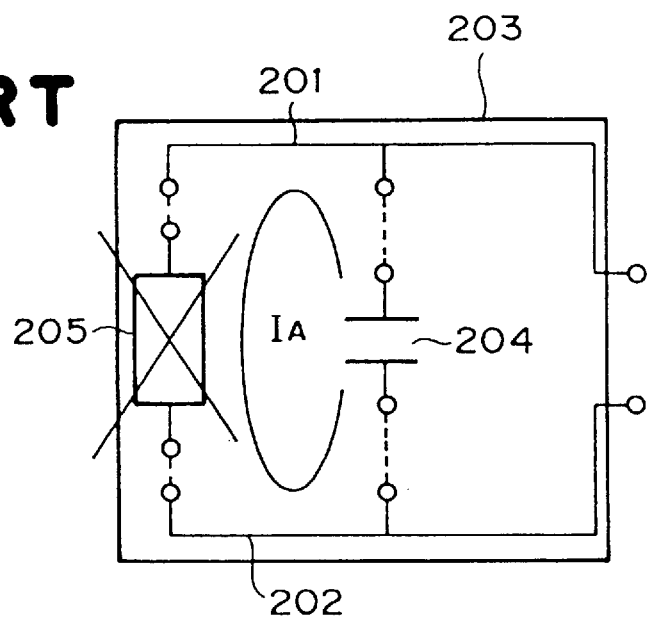

A mechanism of occurrence of breakdown of another component will now be described with reference to FIGS. 2A and 2B. In the case that a capacitor component 204 and another component 205 are set on a printed wiring board 203 having conductor patterns 201 and 202 independent of each other as shown in FIG. 2A, the capacitor component 204 and the other component 205 are in a semiconnected condition with respect to the patterns 201 and 202. Even in such a semiconnected condition, there is a possibility that a closed circuit including the capacitor component 204 and the other component 205 may be formed through the patterns 201 and 202. Accordingly, as shown in FIG. 2B, a current $I_A$ due to charges in the capacitor component 204 may flow through the other component 205 to cause breakdown of the other component 205. Even if the closed circuit is not formed in the semiconnected condition, there is a possibility that the closed circuit may be formed in the subsequent soldering step to cause breakdown of the other component 205.

Figure 3A:
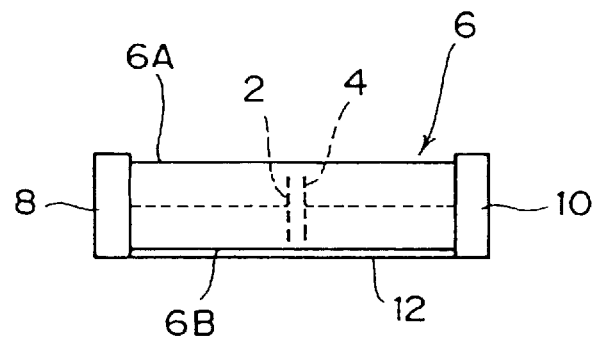
FIGS. 3A and 3B are a side view and a bottom plan view, respectively, showing a first preferred embodiment of the capacitor component according to the present invention.
Figure 3B:
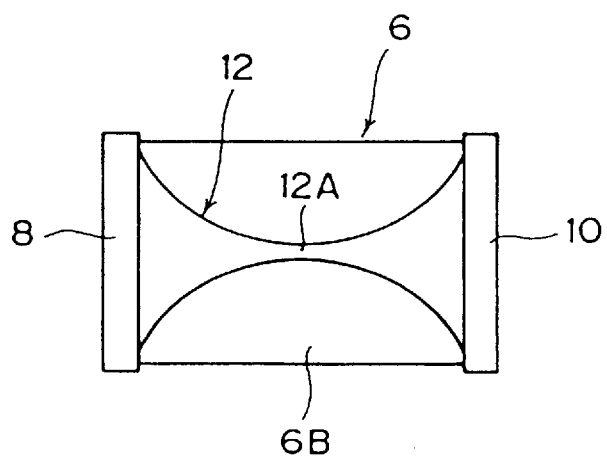

FIGS. 3A and 3B are a side view and a bottom plan view, respectively, showing a first preferred embodiment of the capacitor component according to the present invention. The capacitor component shown in FIGS. 3A and 3B has a component body 6 incorporating a pair of opposed electrodes 2 and 4. A dielectric (not shown) is interposed between the electrodes 2 and 4 to generate a capacitance between the electrodes 2 and 4. The component body 6 has a substantially rectangular solid shape having a top surface 6A and a bottom surface 6B. The component body 6 is formed of molded resin, for example. A pair of terminals 8 and 10 each having a suitable width are formed so as to cover the opposite ends of the component body 6. The terminals 8 and 10 are electrically connected to the electrodes 2 and 4 in the component body 6, respectively. The terminals 8 and 10 are metal films, which are formed preferably of solder to improve solder ability in surface-mounting the capacitor component.

This capacitor component is characterized in that it has a thin-film short-circuiting member 12 on the bottom surface 6B of the component body 6. The short-circuiting member 12 is formed of a low-melting point metal such as solder. The melting point of the low-melting point metal is set equal to or lower than a soldering temperature in surface-mounting. The short-circuiting member 12 has a central portion 12A narrowed to allow easy cutting by heating. When the short-circuiting member 12 is heated to be molten, a tensile force acts on the central portion 12A because of the surface tension of the molten metal, so that the short-circuiting member 12 can be easily cut simply by heating.

The short-circuiting member 12, having such a specific shape, can be obtained by bringing the bottom surface 6B of the component body 6 into contact with a liquid surface of the low-melting point metal in its molten state, for example. Since the molten metal hardly wets the component body 6, but does wets the terminals 8 and 10, well the specific shape of the short-circuiting member 12 as shown in FIG. 3B can be obtained by the surface tension of the molten metal.

A label (not shown) indicating the capacitance and other items of this capacitor component may be printed on the top surface 6A of the component body 6.

In the case of automatically setting this capacitor component onto a printed wiring board, the top surface 6A of the component body 6 is opposed to a mounter machine head, and the bottom surface 6B is opposed to the printed wiring board.

In this preferred embodiment, the short-circuiting member 12 is electrically connected to the terminals 8 and 10. Therefore, discharge of the capacitor component is always effected. Accordingly, when the capacitor component and another component are set or mounted on the printed wiring board, it can be avoided that the other component is broken down by an overcurrent flowing in a closed circuit including the capacitor component and the other component.

The reason why the short-circuiting member 12 is in the form of thin-film is to allow the capacitor component to be set directly on the printed wiring board in surface-mounting. Preferably, the thickness of the short-circuiting member 12 is set equal to or smaller than the height of the projection of the terminals 8 and 10 from the bottom surface 6B of the component body 6.

The sectional area of the narrow central portion 12A of the short-circuiting member 12 is set according to the capacitance of the capacitor component. That is, this sectional area is set to a value large enough to avoid cutting of the central portion 12A in when discharging the capacitor component and small enough to allow easy cutting by heating in surface-mounting.

As the material of the short-circuiting member 12, solder paste, as a mixture of powdered solder and flux, may be used. The solder paste can be easily applied to the bottom surface 6B of the component body 6 to give a desired shape of the short-circuiting member 12 by using a usual printing technique. Further, conductive resin may also be used as the material of the short-circuiting member 12. Also, by the use of the conductive resin, the short-circuiting member having a given shape can be easily formed.

Figure 4A:
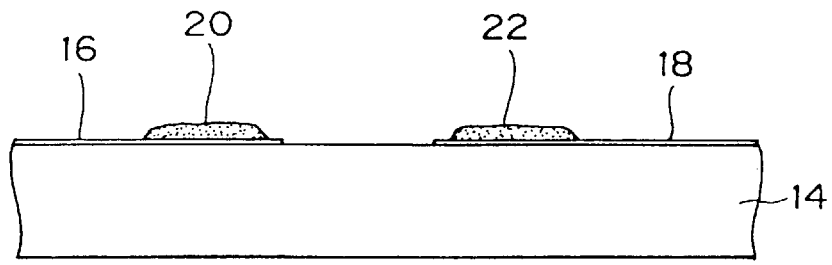
FIGS. 4A, 4B, and 4C are side views showing a mounting process for the capacitor component shown in FIGS. 3A and 3B.
Figure 4B:
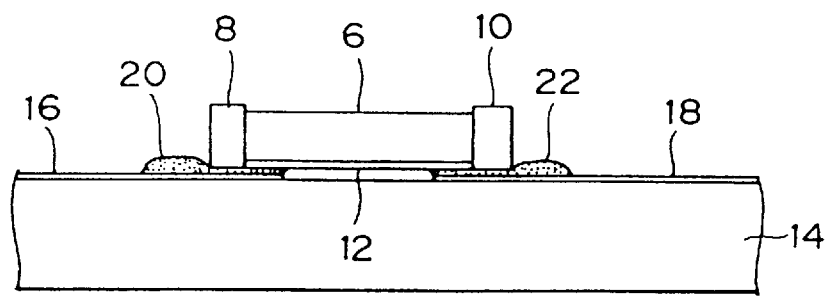
Figure 4C:
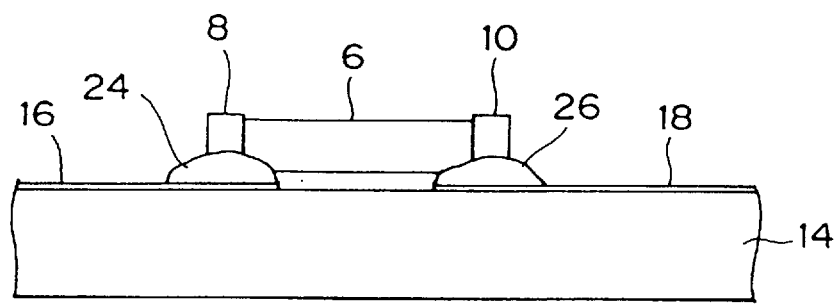

FIGS. 4A, 4B, and 4C illustrate a mounting process for the capacitor component shown in FIGS. 3A and 3B. As shown in FIG. 4A, patterns 16 and 18 to which the terminals 8 and 10 of the capacitor component are to be connected later, respectively, are preliminarily formed on a printed wiring board 14. First, solder paste layers 20 and 22 are coated on the patterns 16 and 18 at positions corresponding to the terminals 8 and 10 of the capacitor component, respectively, as shown in FIG. 4A. In the next step as shown in FIG. 4B, the capacitor component is set on the printed wiring board 14 so that the terminals 8 and 10 come into contact with the solder paste layers 20 and 22, respectively. At this time, the position of the capacitor component is determined to some extent by the tackiness of the solder paste layers 20 and 22. However, if the tackiness of the solder paste layers 20 and 22 is insufficient, adhesive (not shown) may be used to fix the capacitor component to the printed wiring board 14. In the next step, the printed wiring board 14, on which the capacitor component has been set, is heated to perform soldering in a reflow oven, for example. That is, in the high-temperature atmosphere, the flux in the solder paste layers 20 and 22 is vaporized, and the powdered solder in the solder paste layers 20 and 22 is molten. At the same time, the short-circuiting member 12 is also molten.

FIG. 4C shows a condition where the printed wiring board 14 has been cooled to room temperature after completion of the soldering mentioned above. The powdered solder in the solder paste layer 20 and a part of the short-circuiting member 12 that have been molten in the soldering step are resolidified at room temperature to become a soldered portion 24. Similarly, the powdered solder in the solder paste layer 22 and another part of the short-circuiting member 12 that have been molten in the soldering step are resolidified at room temperature to become a soldered portion 26. Thus, mechanical and electrical connections between the terminal 8 and the pattern 16 are obtained, and mechanical and electrical connections between the terminal 10 and the pattern 18 are obtained.

According to the first preferred embodiment as mentioned above, the capacitor component itself has a discharge function, so that it does not break down the other component. Further, the short-circuiting member is cut by heating in the soldering step in surface-mounting of the capacitor component to the printed wiring board, so that the mounting process is not complicated.

Figure 5A:
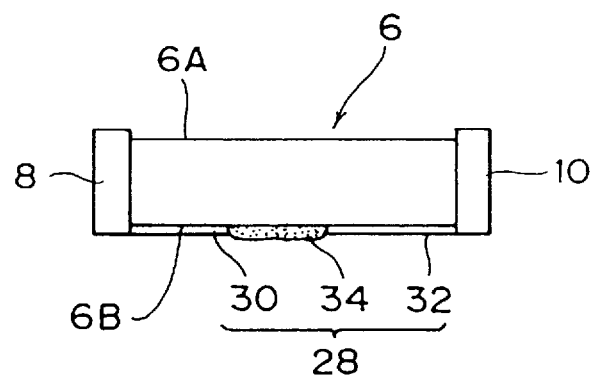
FIGS. 5A and 5B are a side view and a bottom plan view, respectively, showing a second preferred embodiment of the capacitor component according to the present invention.
Figure 5B:
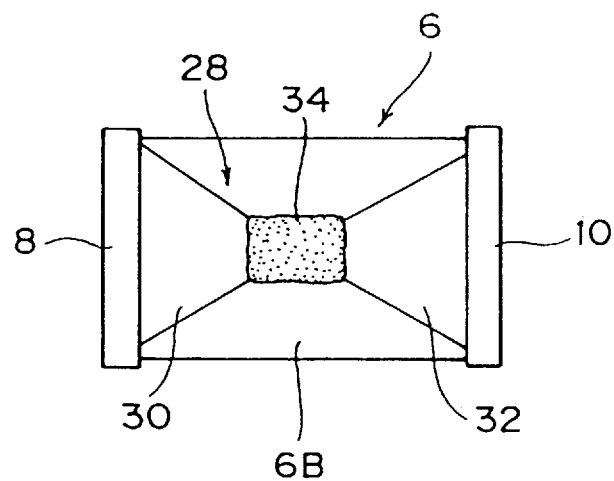

FIGS. 5A and 5B are a side view and a bottom plan view, respectively, showing a second preferred embodiment of the capacitor component according to the present invention. The capacitor component shown in FIGS. 5A and 5B is characterized in that it has a short-circuiting member 28 to be cut at a part thereof by heating to melt it. The short-circuiting member 28 is composed of a metal thin-film 30 having a trapezoidal shape such that it diverges from a substantially central position on a bottom surface 6B of a component body 6 toward the opposite sides of a terminals 8 and 10, another metal thin-film 32 formed in symmetrical relationship with the metal thin-film 30, and a solder paste film 34 formed between the metal thin-films 30 and 32. Thus, the short-circuiting member 28 is a thin-film formed on the bottom surface 6B of the component body 6 to electrically connect the terminals 8 and 10 together.

According to the second preferred embodiment, discharge of the capacitor component is always effected by the short-circuiting member 28, thereby avoiding breakdown of another component when setting or mounting the capacitor component and the other component on a printed wiring board. Further, by improving the surface activities of the metal thin-films 30 and 32 to soldering, a solder component of the solder paste film 34 molten in the soldering step in surface-mounting of the capacitor component to the printed wiring board is resolidified separately near the metal thin-films 30 and 32. Accordingly, the electrical connection between the terminals 8 and 10 is cut to thereby generate a given capacitance between the terminals 8 and 10.

Figure 6A:
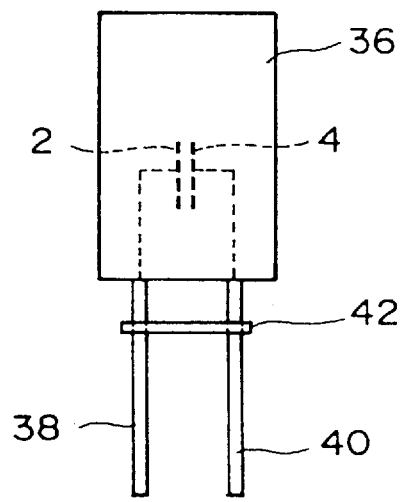
FIGS. 6A and 6B are a side view and a bottom plan view, respectively, showing a third preferred embodiment of the capacitor component according to the present invention.
Figure 6B:
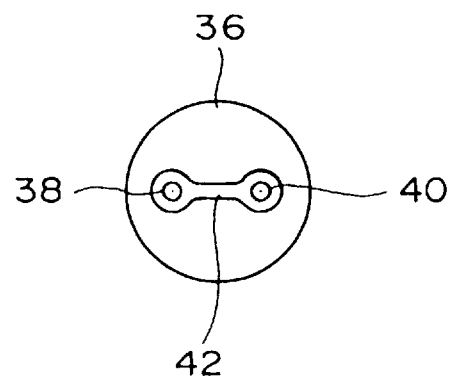

FIGS. 6A and 6B are a side view and a bottom plan view, respectively, showing a third preferred embodiment of the capacitor component according to the present invention. In this preferred embodiment, a pair of electrodes 2 and 4 for generating a capacitance therebetween is incorporated in a substantially cylindrical component body 36. A pair of lead terminals 38 and 40 project from the bottom surface of the component body 36. The lead terminals 38 and 40 are electrically connected to the electrodes 2 and 4, respectively. The lead terminals 38 and 40 are adapted to be inserted into through-holes formed in a printed wiring board and be subjected to soldering.

A short-circuiting member 42 is provided so as to connect the lead terminals 38 and 40 at their portions near the component body 36. Accordingly, the lead terminals 38 and 40 are electrically connected together by the short-circuiting member 42 to always effect discharge of the capacitor component. The reason why the short-circuiting member 42 is located near the component body 36 is to ensure required lengths of projecting portions of the lead terminals 38 and 40 in setting the capacitor component onto the printed wiring board. The distance between the short-circuiting member 42 and the bottom surface of the component body 36 determines a mount height of the capacitor component when it is mounted on the printed wiring board. The short-circuiting member 42 is formed of low-melting point metal such as solder, and the melting point of the low-melting point metal is set equal to or lower than a soldering temperature in soldering the capacitor component to the printed wiring board. As shown in FIG. 6B, the short-circuiting member 42 has a narrow central portion which can be easily cut only by heating to melt it.

Figure 7A:
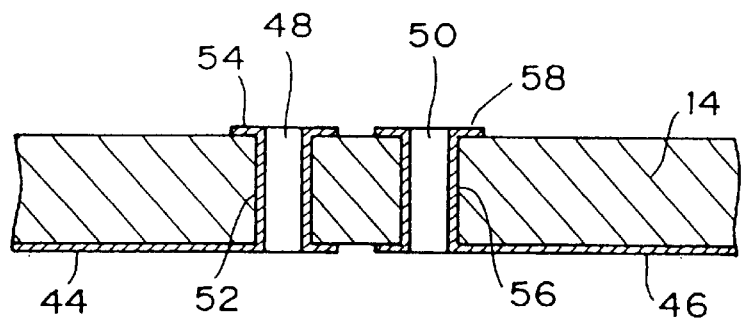
FIGS. 7A, 7B, and 7C are views showing a mounting process for the capacitor component shown in FIGS. 6A and 6B.
Figure 7B:
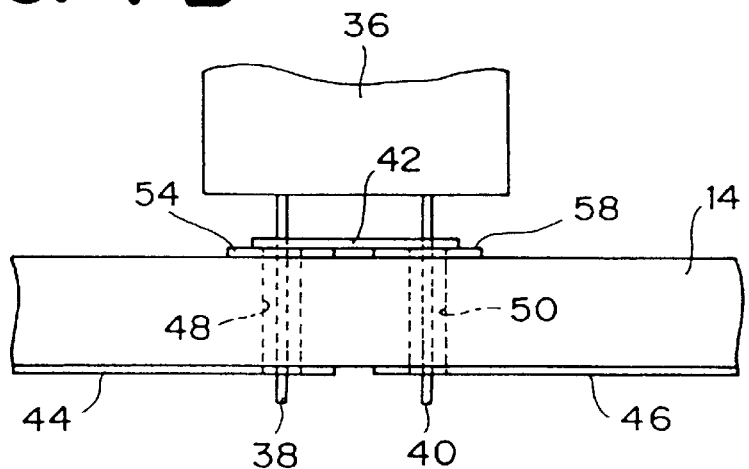
Figure 7C:
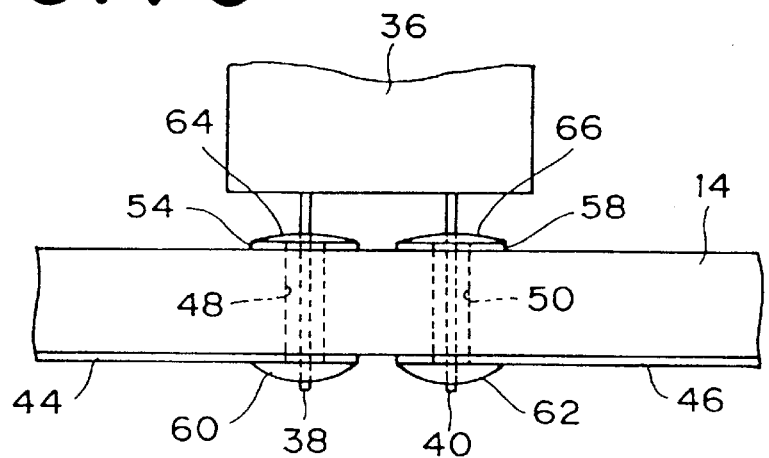

FIGS. 7A, 7B, and 7C illustrate a mounting process for the capacitor component shown in FIGS. 6A and 6B. As shown in FIG. 7A, independent patterns 44 and 46 to which the lead terminals 38 and 40 of the capacitor component are to be connected later are preliminarily formed on the lower surface of a printed wiring board 14. The printed wiring board 14 has through-holes 48 and 50 for insertion of the lead terminals 38 and 40 therethrough, respectively. The pattern 44 is preliminarily connected through a pattern 52 formed on the wall surface of the through-hole 48 to a circular pad 54 formed on the upper surface of the printed wiring board 14. Similarly, the pattern 46 is preliminarily connected through a pattern 56 formed on the wall surface of the through-hole 50 to a circular pad 58 formed on the upper surface of the printed wiring board 14.

As shown in FIG. 7B, the lead terminals 38 and 40 of the capacitor component are first inserted into the through-holes 48 and 50, respectively, until the short-circuiting member 42 comes into contact with the pads 54 and 58, thereby setting the capacitor component onto the printed wiring board 14. In the next step, suitable flux (not shown) is applied to a portion to be soldered, and the lower surface of the printed wiring board 14 is then brought into contact with a liquid surface of molten solder in a molten solder bath (not shown), thereby soldering the lead terminals 38 and 40 to the patterns 44 and 46, respectively.

FIG. 7C shows a condition where the printed wiring board 14 has been cooled to room temperature after completion of the soldering mentioned above. Reference numeral 60 denotes a soldered portion between the lead terminal 38 and the pattern 44, and reference numeral 62 denotes a soldered portion between the lead terminal 40 and the pattern 46. Further, reference numerals 64 and 66 denote separated portions of the short-circuiting member 42 resolidified on the pads 54 and 58, respectively. That is, in the soldering step mentioned above, heat of the molten solder transfers through the lead terminals 38 and 40 and the other associated parts to the short-circuiting member 42, so that the short-circuiting member 42 is molten by the heat to be separated by its surface tension into the portion corresponding to the pad 54 and the portion corresponding to the pad 58. Depending on heating conditions, the portion shown by reference numeral 60 (62) and the portion shown by reference numeral 64 (66) are sometimes integrated together within the through-hole 48 (50). However, such integration has no influence upon the mounting of the capacitor component, but rather preferable to improve mechanical strength.

Figure 8:
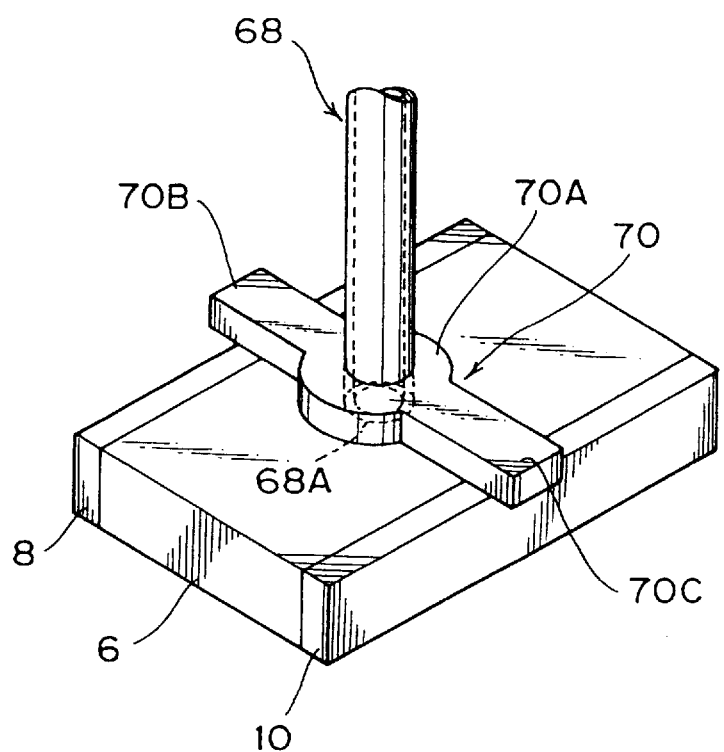
FIG. 8 is a perspective view showing a preferred embodiment of the mounter machine head according to the present invention.

FIG. 8 is a perspective view of a preferred embodiment of the mounter machine head according to the present invention. This mounter machine head is employed in surface-mounting a capacitor component having no discharge function, e.g., a capacitor component obtained by eliminating the short-circuiting member 12 from the configuration shown in FIGS. 3A and 3B. The mounter machine head shown in FIG. 8 includes a substantially tubular vacuum head 68 having an opening end 68A and a hollow inside portion communicating therewith, and a conductive pad 70 of metal or the like provided at the opening end 68A of the vacuum head 68. The vacuum head 68 is operatively connected through a flexible tube (not shown) to a vacuum pump (not shown) at an end opposite to the opening end 68A. Accordingly, a vacuum for attracting the capacitor component to the opening end 68A by suction is given to the hollow inside portion of the vacuum head 68 by the vacuum pump.

The conductive pad 70 consists of a flange portion 70A having a through-hole in which the opening end 68A of the vacuum head 68 is inserted and fixed, and a pair of arm portions 70B and 70C integrally projecting from opposite side portions of the flange portion 70A. The lower surface of the conductive pad 70 is flat, and the inner diameter of the opening end 68A of the vacuum head 68 is smaller than the width and length of the component body 6 of the capacitor component. Accordingly, in attracting the capacitor component to the vacuum head 68 by the vacuum given to the hollow inside portion of the vacuum head 68 from the vacuum pump, the arm portions 70B and 70C of the conductive pad 70 are so located as to come into contact with the terminals 8 and 10 of the capacitor component, respectively, thereby effecting discharge of the capacitor component.

A mounter machine to which this mounter machine head is applied comprises an XY table capable of placing, at a predetermined position, a printed wiring board for surface-mounting the capacitor component thereon, a robot arm for moving the mounter machine head in three-axis directions, i.e., XYZ directions, and a controller for controlling the XY table and the robot arm according to a given program. In setting the capacitor component on the printed wiring board by using the mounter machine, breakdown of another component to be mounted or set on the printed wiring board can be avoided, because the discharge of the capacitor component has already been completed, as mentioned above, prior to this setting operation of the capacitor component.

Figure 9A:
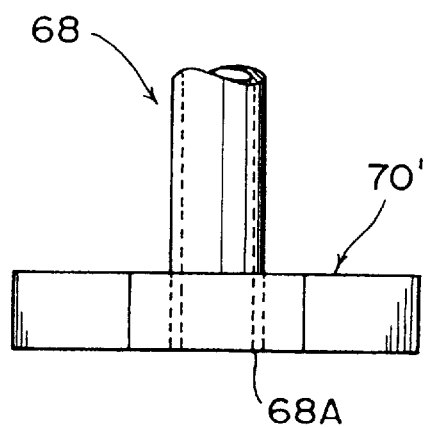
FIGS. 9A and 9B are elevational views showing other preferred embodiments of the mounter machine head according to the present invention.
Figure 9B:
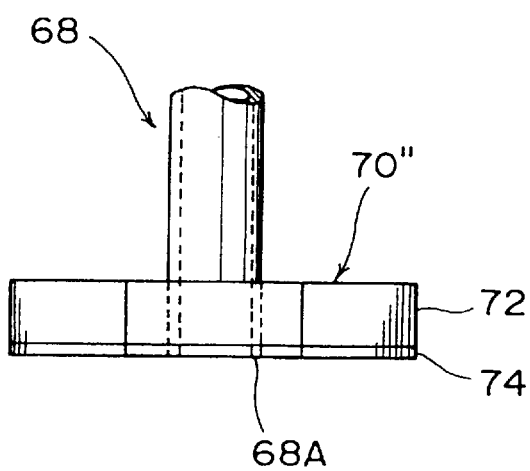

FIGS. 9A and 9B are elevational views of other preferred embodiments of the mounter machine head according to the present invention. The mounter machine head shown in FIG. 9A is characterized in that a conductive pad 70' provided at an opening end 68A of a vacuum head 68 is formed of an elastic material. As the elastic material, conductive rubber or conductive resin may be used. The use of the conductive pad 70' formed of such an elastic material allows easy attraction of a capacitor component having an uneven surface, and further allows suppression of shock against the mounter machine head, the capacitor component, and the printed wiring board in attracting the capacitor component to the mounter machine head or setting the capacitor component onto the printed wiring board.

In modification, a conductive pad 70" as shown in FIG. 9B may be used. The conductive pad 70" has a laminated structure consisting of a part 72 formed of metal and a part 74 formed of a conductive elastic material. In this manner, at least a part of the conductive pad coming into abutment against the terminal pair of the capacitor component is formed of an elastic material, thereby minimizing the shock.

The discharge method according to the present invention is applicable to a capacitor component having no discharge function as similar to the preferred embodiment shown in FIG. 8. The discharge method according to the present invention will now be described more specifically.

Figure 10A:
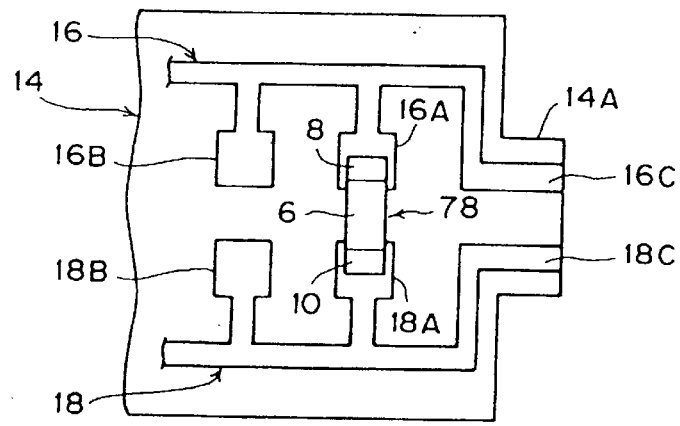
FIGS. 10A, 10B, and 10C are plan views illustrating a first preferred embodiment of the discharge method according to the present invention.
Figure 10B:
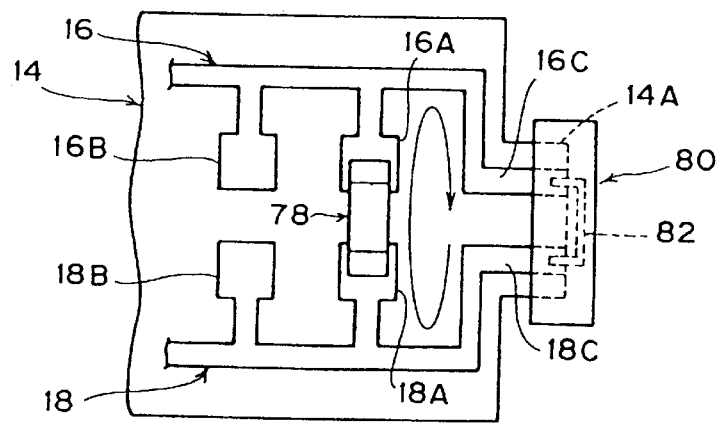
Figure 10C:
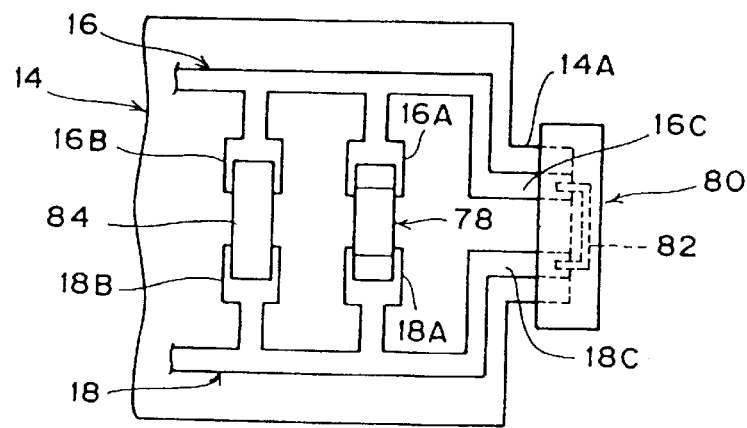

FIGS. 10A, 10B, and 10C illustrate a first preferred embodiment of the discharge method according to the present invention.

As shown in FIG. 10A, independent patterns 16 and 18 are preliminarily formed on a printed wiring board 14. The printed wiring board 14 has a tongue portion 14A projecting from a side edge of the printed wiring board 14. The pattern 16 includes a pad portion 16A to be connected to a capacitor component, a pad portion 16B to be connected to another component such as an IC chip, and a contact portion 16C elongated on the tongue portion 14A of the printed wiring board 14. Similarly, the pattern 18 includes pad portions 18A and 18B and a contact portion 18C respectively corresponding to the pad portions 16A and 16B and the contact portion 16C.

In the first step as shown in FIG. 10A, a capacitor component 78 having a component body 6 and terminals 8 and 10 is set on the printed wiring board 14. At this time, the terminals 8 and 10 of the capacitor component 78 come into contact with the pad portions 16A and 18A, respectively, through solder paste (not shown), thereby maintaining the position of the capacitor component 78.

In the next step as shown in FIG. 10B, a discharge jig 80 is fitted to the tongue portion 14A of the printed wiring board 14. The discharge jig 80 has a groove for receiving the tongue portion 14A, and a substantially C-shaped probe pin 82 formed of a conductor is provided in the depth of this groove. When the discharge jig 80 is thus fitted to the tongue portion 14A of the printed wiring board 14, the opposite ends of the probe pin 82 come into contact with the contact portions 16C and 18C of the patterns 16 and 18 to thereby short-circuit the patterns 16 and 18. Accordingly, a closed circuit consisting of the capacitor component 78, the patterns 16 and 18, and the probe pin 82 is formed to effect discharge of the capacitor component 78.

In the next step as shown in FIG. 10C, a load component 84, such as an IC chip, is set on the printed wiring board 14. At this time, a closed circuit consisting of the load component 84, the patterns 16 and 18, and the capacitor component 78 is formed. However, there is no possibility that the load component 84 may break down, because the capacitor component 78 has already been discharged.

After thus setting both the capacitor component 78 and the load component 84 on the printed wiring board 14, the printed wiring board 14 is put into a reflow oven to thereby perform soldering. In the case that the discharge jig 80 is kept fitted to the printed wiring board 14 during the soldering, the discharge jig 80 is required to have good heat resistance. From this point of view, the discharge jig 80 may be removed from the printed wiring board 14 before the soldering. In modification, the fitting of the discharge jig 80 to the printed wiring board 14 may be carried out prior to the setting of the capacitor component 78 on the printed wiring board 14.

Finally, the discharge jig 80 is removed from the printed wiring board 14 after setting or mounting the capacitor component 78, the load component 84, and other necessary components (not shown) to the printed wiring board 14. Thus, a printed wiring board unit is completed. In this condition, the tongue portion 14A may be utilized for connection of a connector in subjecting this unit to practical use.

The discharge method according to the present invention is most effective when a semiconductor component such as an IC chip is used as the load component, because the withstand voltage of a semiconductor component is generally low.

Figure 11A:
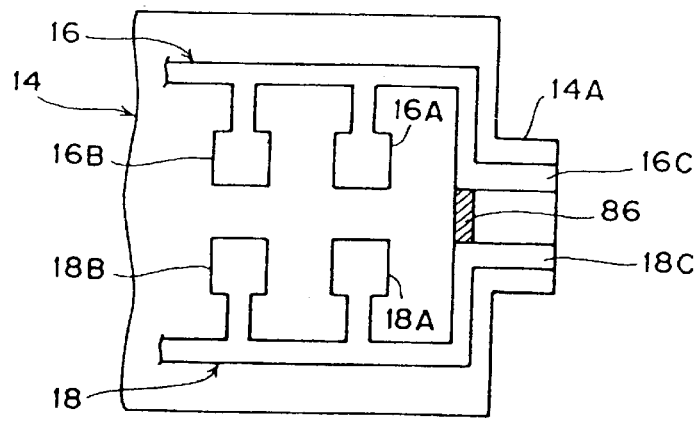
FIGS. 11A, 11B, and 11C are plan views illustrating a second preferred embodiment of the discharge method according to the present invention.
Figure 11B:
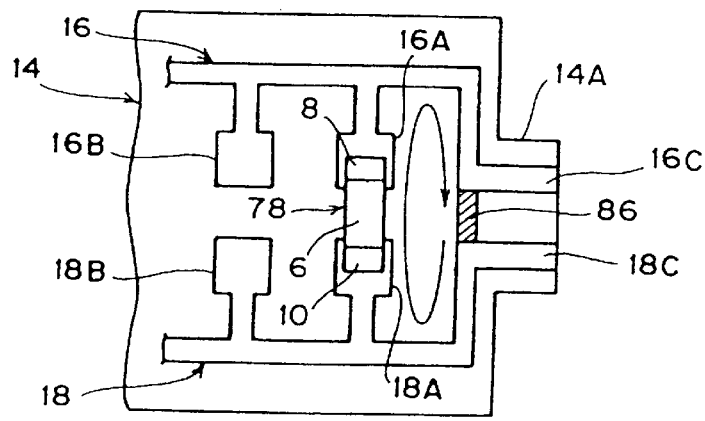
Figure 11C:
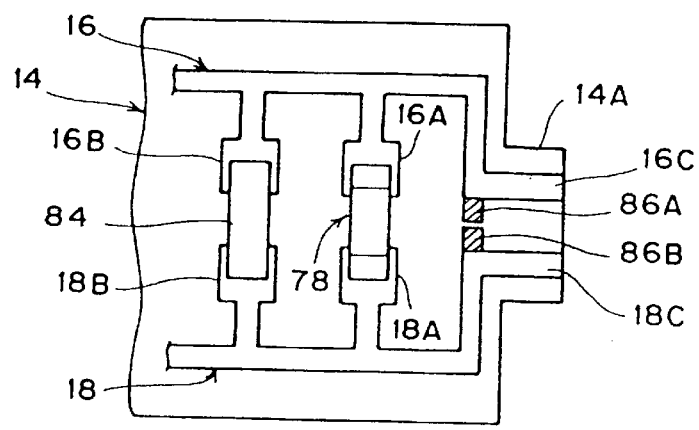

FIGS. 11A, 11B, and 11C illustrate a second preferred embodiment of the discharge method according to the present invention. This preferred embodiment is characterized in that a dummy pattern 86 is preliminarily formed on a printed wiring board 14 as shown in FIG. 11A. The dummy pattern 86 serves to short-circuit a pair of patterns 16 and 18, and it is formed in the vicinity of a tongue portion 14A of the printed wiring board 14, for example. In this preferred embodiment, the dummy pattern 86 is a copper thin-film formed in the same process as that for the patterns 16 and 18.

In the first step as shown in FIG. 11B, a capacitor component 78 is set on the printed wiring board 14 to bring terminals 8 and 10 of the capacitor component 78 into contact with pad portions 16A and 18A, respectively. Accordingly, a closed circuit consisting of the capacitor component 78, the patterns 16 and 18, and the dummy pattern 86 is formed to thereby effect discharge of the capacitor component 78. In the next step, a load component 84 such as an IC chip is set on the printed wiring board 14, and soldering of the capacitor component 78 and the load component 84 is next performed. Thereafter, the dummy pattern 86 is cut at its central portion to form separated parts 86A and 86B.

Also in this preferred embodiment, the capacitor component can be easily discharged.

Figure 12A:
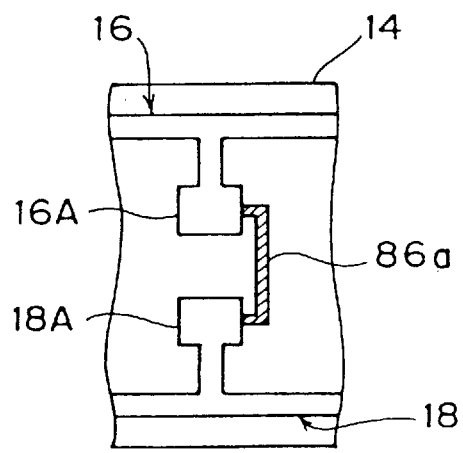
FIGS. 12A, 12B, and 12C are plan views illustrating various modifications of a dummy pattern shown in FIGS. 11A to 11C.
Figure 12B:
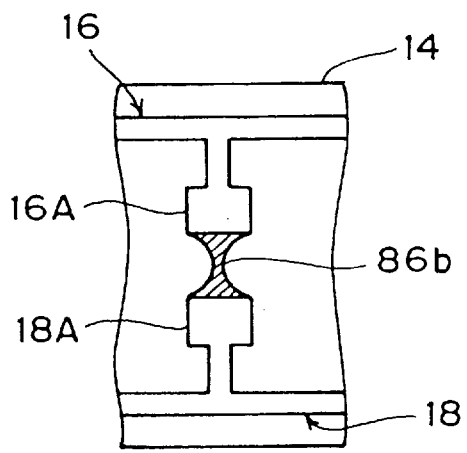
Figure 12C:
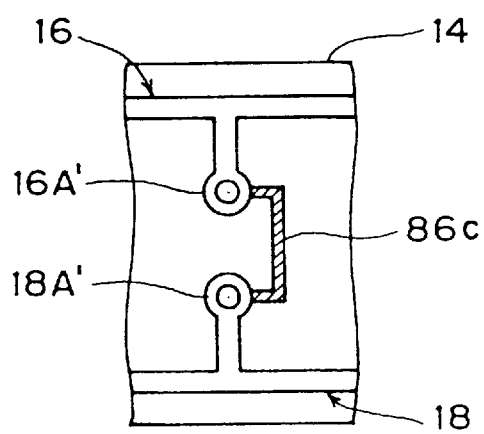

FIGS. 12A, 12B, and 12C illustrate various modifications of the dummy pattern employable in the present invention. In the modification shown in FIG. 12A, a dummy pattern 86a is so formed as to directly connect pad portions 16A and 18A on which a capacitor component is to be set. By forming such a dummy pattern at every capacitor component setting portion on a printed wiring board, breakdown of other components can be perfectly prevented. In the modification shown in FIG. 12B, a dummy pattern 86b is characterized in that it is formed of low-melting point metal such as solder and has a narrow central portion. The dummy pattern 86b is so formed as to directly connect pad portions 16A and 18A like the dummy pattern 86a. When a capacitor component is set on the pad portions 16A and 18A, discharge of the capacitor component is effected by the dummy pattern 86b. Furthermore, when a printed wiring board 14 is heated in performing soldering, the dummy pattern 86b is molten to easily cut at its narrow central portion. Accordingly, the workability in this modification is improved more than in the case where the dummy pattern is formed from a copper thin-film as in the modification shown in FIG. 12A. In the modification shown in FIG. 12C, a dummy pattern 86c is suitable in mounting a capacitor component having lead terminals. The dummy pattern 86c is so formed as to directly connect pads 16A' and 18A' formed so as to be adapted for the lead terminals. In this manner, the discharge method according to the present invention is applicable not only to a capacitor component adapted to be surface-mounted, but also to a capacitor component having lead terminals.

In the present invention, a discharge current can be set to a proper value by making means for short-circuiting the terminals of the capacitor component (the short-circuiting member, the conductive pad, and the dummy pattern) have a certain level of resistance, thereby allowing prevention of breakdown of the capacitor component itself due to an overcurrent.

While the present invention is effective especially for a tantalum capacitor and a ceramic capacitor, which have relatively small capacitances and whose discharge is not considered at all in the prior art, it is needless to say that the present invention can also be applied to an aluminum electrolytic capacitor fit for a large capacitance.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A mounter machine head to be used in surface-mounting a capacitor component to a printed wiring board, said capacitor component comprising a component body incorporating first and second electrodes between which a capacitance is generated, and first and second terminals electrically connected to said first and second electrodes, respectively; said mounter machine head comprising:

a vacuum head having an opening end and a hollow inside portion communicating with said opening end, said hollow inside portion being given a vacuum to attract said capacitor component by suction; and a conductive pad to short-circuit said first and second terminals, said conductive pad being provided at said opening end so as to come into contact with said first and second terminals when said capacitor component is attracted to said mounter machine head by the vacuum.

2. A mounter machine head according to claim 1, wherein at least a portion of said conductive pad coming into contact with said first and second terminals is formed of an elastic material.

3. A mounter machine head according to claim 2, wherein said elastic material is conductive resin.

4. A mounter machine head according to claim 1, wherein said conductive pad comprises a flange portion connected to said vacuum head, and a pair of arm portions projecting from said flange portion so as to come into contact with said first and second terminals, respectively.

5. A method comprising:

providing a mounter machine head comprising a conductive pad;

attracting a capacitor component to the mounter machine head by a vacuum such that the conductive pad comes into contact with first and second terminals of the capacitor component, thereby short-circuiting said first and second terminals; and mounting the capacitor component onto a printed wiring board by using the mounter machine head.

6. A mounter machine head to be used in surface-mounting a capacitor component to a printed wiring board, comprising:

a conductive pad to short-circuit first and second terminals of the capacitor component, said conductive pad being provided at an opening end of the mounter machine head so as to come into contact with the first and second terminals when the capacitor component is attracted to the mounter machine head.

* * * * *